United States Patent [19]

Miyaoka et al.

[11] Patent Number: 4,977,338
[45] Date of Patent: Dec. 11, 1990

[54] HIGH SPEED BIPOLAR-MOS LOGIC CIRCUIT INCLUDING A SERIES COUPLED ARRANGEMENT OF A BIPOLAR TRANSISTOR AND A LOGIC BLOCK HAVING A MOSFET

[75] Inventors: Shuuichi Miyaoka, Ohme; Masanori Odaka, Kodaira; Katsumi Ogiue, Hinode, all of Japan

[73] Assignee: Hitachi, Ltd., Tokyo, Japan

[21] Appl. No.: 336,425

[22] Filed: Apr. 11, 1989

[30] Foreign Application Priority Data

Apr. 12, 1988 [JP] Japan .................................. 63-89620

[51] Int. Cl.$^5$ ............................................. H03K 17/04
[52] U.S. Cl. ..................................... 307/446; 307/443; 307/475; 307/570
[58] Field of Search ............... 307/443, 446, 448, 475, 307/570

[56] References Cited

U.S. PATENT DOCUMENTS

| | | | |
|---|---|---|---|
| 4,453,095 | 6/1984 | Wrathall | 307/475 |
| 4,585,962 | 4/1986 | Sasayama | 307/570 |
| 4,586,004 | 4/1986 | Valdez | 307/446 X |
| 4,645,951 | 2/1987 | Uragami | 307/446 X |
| 4,760,293 | 7/1988 | Hebenstreit | 307/446 X |

*Primary Examiner*—David Hudspeth
*Attorney, Agent, or Firm*—Antonelli, Terry, Stout & Kraus

[57] ABSTRACT

A high-speed bipolar MOS logic circuit is provided which includes a load resistance coupled between a first power supply voltage terminal and an output terminal and a bipolar transistor having a collector coupled to said output terminal and a base for receiving a predetermined voltage or an input signal a logic block is also provided including one or more MOSFETs having a source-drain path coupled in series between the emitter of said bipolar transistor and a second power supply voltage terminal.

39 Claims, 3 Drawing Sheets

HIGH SPEED BIPOLAR-MOS LOGIC CIRCUIT INCLUDING A SERIES COUPLED ARRANGEMENT OF A BIPOLAR TRANSISTOR AND A LOGIC BLOCK HAVING A MOSFET

BACKGROUND OF THE INVENTION

The present invention relates to a logic circuit formed in a semiconductor integrated circuit device and, more particularly, to a technique which is effective if applied to a high-speed logic circuit including a bipolar transistor and an insulated gate type field effect transistor (which will be shortly referred to as the "MOSFET").

An emitter coupled logic (which will be shortly referred to as the "ECL") circuit can operate at a high speed because its output signal can have its amplitude reduced. However, this ECL circuit has a high power consumption because it includes a constant current supply transistor rendered conductive at all times.

On the other hand, a CMOS (or complementary MOS) circuit formed of P-channel and N-channel MOSFETs has a low power consumption because only one of the P-channel and N-channel MOSFETs is rendered conductive in response to an input signal. Since, however, the amplitude of the output signal of the CMOS circuit is substantially equal to the voltage difference between a power supply voltage ($V_{DD}$) and a ground potential ($V_{SS}$) coupled to the CMOS circuit, the time period required for charging and discharging a load capacitance coupled to the output of the CMOS circuit is long. As a result, the operating speed of the CMOS circuit is dropped to a low value. In the case of the CMOS circuit, moreover, the CMOS circuit has its propagation delay time elongated to the higher value for the higher level of the load capacitance coupled to the output of the CMOS circuit.

As a logic circuit having both the high speed of the aforementioned ECL circuit and the low power consumption of the CMOS circuit, there has been highlighted in recent years a bipolar CMOS logic circuit (which may be shortly referred to as the "BiCMOS circuit") which is formed by coupling a bipolar transistor and the CMOS circuit. This BiCMOS circuit is disclosed in the Japanese Patent Laid-Open No. 59 - 11034 (which corresponds to the U.S. Pat. No. 4,719,373), for example. This BiCMOS circuit is constructed of: a pair of output bipolar transistors coupled in the form of a totem pole between the power supply voltage ($V_{DD}$) and the ground voltage ($V_{SS}$); and a CMOS circuit coupled to the respective bases of the output bipolar transistors to effect the push-pull operations of the same. For these operations, the output signal of the BiCMOS circuit is set at a high level such as ($V_{DD} - V_{BE}$) and at a low level such as ($V_{SS} - V_{BE}$). Here, the $V_{BE}$ designates the base-emitter potential of the bipolar transistor. Therefore, the high and low levels of the output signal are determined at 4.3 V and 0.7 V, respectively, in case the power supply voltage ($V_{DD}$), the ground voltage ($V_{SS}$) and the base-emitter voltage ($V_{SS}$) are set at 5 V, 0 V and 0.7 V, respectively.

The logic circuit formed by combining the bipolar transistor and the MOSFET is exemplified by: the circuit which is shown in FIG. 7 of the U.S. Pat. No. 3,609,479 issued on Sept. 24, 1971; or the circuit which is disclosed in the Japanese Patent Application No. 61 - 308456 filed on Dec. 26, 1986 by Hitachi, Ltd., (which corresponds to the U.S. patent application No. 132,368 filed on Dec. 14, 1987 and Korean Patent Application No. 1987 - 14711).

On the other hand, the NAND circuit formed of the bipolar transistor is disclosed in FIG. 1 of the Japanese Patent Laid-Open No. 54 - 87160 laid open on July 11, 1979. The NAND circuit formed of the MOSFET is disclosed in FIG. 2(a) of "A High-Speed Ultra-Low Power 64K CMOS EPROM with On-Chip Test Functions" reported by Mark W. Knecht et al on pp. 554 to 561 of IEEE JOURNAL OF SOLID-STATE CIRCUIT, Vol. SC-18, No. 5, October 1983.

SUMMARY OF THE INVENTION

We have examined the bipolar MOS logic circuit which is composed of the bipolar transistor and the MOSFET and which has a small output signal amplitude like the ECL circuit and a low power consumption like the CMOS circuit. Our examinations have revealed that such bipolar MOS logic circuit has to be designed considering the drop of a breakdown voltage such as the hot-carrier breakdown voltage accompanying the high speediness and integration of the MOSFET and the process dependency of the MOSFET characteristics.

An object of the present invention is to provide a bipolar MOS logic circuit which can operate within a small amplitude.

Another object of the present invention is to increase the operating speed and decrease the power consumption of a high-speed logic integrated circuit including a plurality of bipolar MOS logic circuits.

The above-specified and other objects and novel features of the present invention will become apparent from the following description to be made with reference to the accompanying drawings.

The representatives of the present invention to be disclosed hereinafter will be summarized in the following.

A bipolar MOS logic circuit comprises: load means (or resistance) coupled between a first power supply voltage terminal and an output terminal; a bipolar transistor having a collector coupled to said output terminal and a base for receiving a predetermined voltage or input signal; and a logic block including one or more MOSFETs having a source-drain path connected in series between the emitter of said bipolar transistor and a second power supply voltage terminal.

According to the above-specified means, it is possible to provide a bipolar MOS logic circuit which can enjoy a high speed and a low power consumption while solving the problems caused by the high speediness and integration of the MOSFET, for the reasons to be described in the following.

Specifically, the bipolar transistor is provided to set the voltage between its emitter and the second power supply voltage terminal ($V_{SS}$) at such a level as can retain the hot-carrier breakdown voltage of the fine MOSFET contained in the logic block. The emitter voltage of the bipolar transistor is clamped at a value which is determined by subtracting the base-emitter forward voltage $V_{BE}$ from the voltage applied to the base thereof, on condition that it is turned on. Therefore, the emitter voltage of the bipolar transistor can be so controlled by controlling the voltage to be applied to the base thereof as to retain the hot-carrier breakdown voltage of the MOSFET. Moreover, the process dispersion of the element characteristics of the bipolar transistor is smaller than that of the element characteristics of the MOSFET so that the logic amplitude of an output signal appearing at the output terminal of the circuit has its process dependency reduced.

On the other hand, the logic block is constructed of one or more MOSFETs so that its layout area can be made fine. In other words, the presence of the bipolar transistor makes it possible to make finer the one or more MOSFETs of the logic block without any considerable fear of the hot-carrier breakdown voltage. As a result, a semiconductor device including a plurality of bipolar MOS logic circuits according to the present invention can have its chip area and cost dropped.

In the circuit structure thus far described, moreover, the power consumption can be dropped because an electric current flows through the circuit only when all the bipolar transistor and the one or more MOSFETs are rendered conductive.

Still moreover, the logic block is composed of one or more MOSFETs. As a result, the saturation operation of the bipolar transistor, which may probably occur in case the logic block is composed of the bipolar transistor, and the resultant drop of the operating speed of the logic circuit are prevented. Accordingly, the operations of the bipolar CMOS logic circuit according to the present invention can be speeded up.

This speedup of the circuit is also achieved as a result that the output signal of the circuit has a small amplitude. The amplitude of the output signal of the bipolar MOS logic circuit is substantially equalized to that of the output signal of the ECL circuit.

DESCRIPTION OF THE PREFERRED EMBODIMENTS

Figure 1:
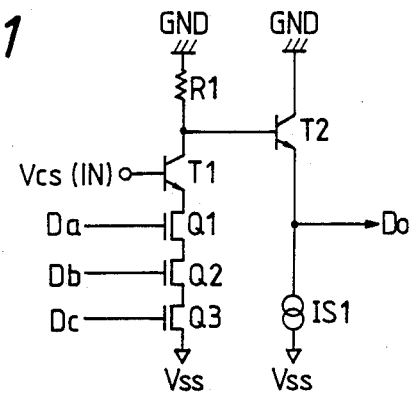
FIG. 1 is a circuit diagram showing one embodiment of a bipolar MOS logic circuit included in a high-speed logic circuit to which is applied the present invention.

FIG. 1 is a circuit diagram showing one embodiment of a logic circuit included in a high-speed logic integrated circuit to which is applied the present invention. The high-speed logic integrated circuit of the present embodiment includes a multiplicity of logic circuits which are made to have a circuit structure similar to that of the logic circuit of FIG. 1. The circuit elements constituting those logic circuits are formed over one semiconductor substrate of single crystal silicon or the line, although not especially limitative thereto, together with other circuit elements included in the high-speed logic integrated circuit. In the following drawings, the MOSFETs having arrows attached to their channel (or back gate) portions are of P-channel type and are differentiated from the N-channel MOSFETs having no arrow. These MOSFETs are of enhancement type. Moreover, all the bipolar transistors shown are NPN type transistors.

In FIG. 1, the logic circuit includes a (first) bipolar transistor T1, although not especially limitative thereto. This transistor T1 has its collector coupled through a load resistance R1 to a terminal for supplying the ground potential GND (i.e., a first power supply voltage) of the circuit and its base adapted to be supplied with a predetermined voltage e.g., a constant voltage $V_{CS}$. Between the emitter of the transistor T1 and a terminal for supplying the power supply voltage $V_{SS}$ (i.e., a second power supply voltage) of the circuit, there are provided three N-channel MOSFETs (i.e., first, second and third MOSFETs) Q1 to Q3 having source-drain paths connected in series. These MOSFETs Q1 to Q3 have their gates supplied with input signals Da to Dc, respectively, from another not-shown logic circuit of the high-speed logic integrated circuit.

In the present embodiment, the power supply voltage $_{SS}$ of the circuit is set at a negative power supply voltage having a relatively small absolute value such as $-3$ V, although not especially limitative thereto. The constant voltage $V_{CS}$ is set at such a predetermined negative voltage value, e.g., $-1.4$ V as can establish a collector current necessary for the transistor T1. In case the power supply voltage $V_{SS}$ is at 3.3 V, the constant voltage $V_{CS}$ is set at $-1.7$ V. On the other hand, the input signals Da to Dc are set to have their signal amplitudes, i.e., the levels between their high and low levels as low as about 0.8 V. In other words, the input signals Da to Dc having the signal amplitudes of ECL level are supplied to the respective gates of the MOSFETs Q1 to Q3.

The transistor T1 has its collector further coupled to the base of a (second) bipolar transistor T2. This transistor T2 in turn has its collector coupled to the ground potential GND of the circuit. Between the emitter of the transistor T2 and the power supply voltage $V_{SS}$, there is coupled a current supply e.g., a constant current supply IS1, although not especially limitative thereto. Thus, the transistor T2 constitutes an output emitter-follower circuit together with the constant current supply IS1. The emitter potential of the transistor T2 is set at the output signal Do of the logic circuit.

Figure 2:
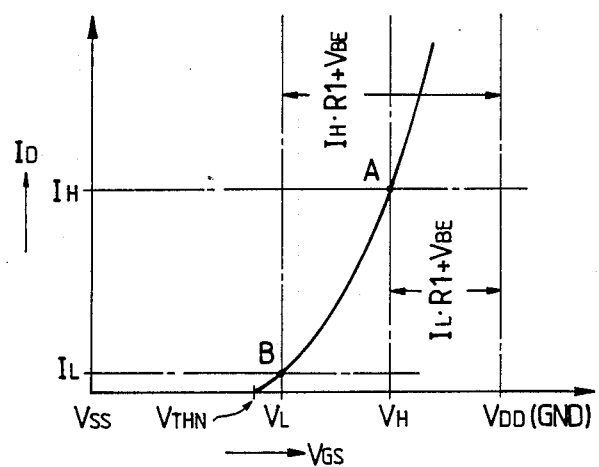
FIG. 2 is a characteristic curve for explaining the operations of the bipolar MOS logic circuit of FIG. 1.

FIG. 2 presents a characteristic curve for explaining the operations of the logic circuit of FIG. 1. FIG. 2 has its ordinate indicating the value of the drain current $I_D$ of the aforementioned MOSFETs Q1 to Q3 and so on and its abscissa indicating the gate-source voltage $V_{GS}$ of the same.

In FIG. 2, the drain current $I_D$ of the MOSFETs Q1 to Q3 and so on is broken when the gate-source voltage $V_{GS}$ becomes lower than a threshold voltage $V_{THN}$. When, on the other hand, the gate-source voltage $V_{GS}$ exceeds the threshold voltage $V_{THN}$, the drain current $I_D$ abruptly rises according to the gate-source voltage $V_{GS}$.

Here, the input signals Da to Dc take two values, i.e., a low level $V_L$ and a high level $V_H$, and the MOSFETs Q1 to Q3 transit between two states indicated at points A and B according to the levels of the corresponding input signals Da to Dc. Although not especially limitative, the low level $V_L$ of the input signals Da to Dc is set at a level slightly higher than the addition of the power supply voltage $V_{SS}$ of the circuit and the threshold voltage $V_{THN}$ of the MOSFETs Q1 to Q3. At this time, for example, a very small current $I_L$ such as several µA is supplied to the drains of the MOSFETs Q1 to Q3. On the other hand, the high level $V_H$ of the input signals Da to Dc is set at a level higher by about 0.8 V than the above-specified low level $V_L$, although not especially limitative thereto. At this time, the drains of the MOSFETs Q1 to Q3 are supplied with a relatively large current $I_H$ about one thousand as high as the aforementioned current $I_L$, i.e., several mA, for example, on condition that all the input signals Da to Dc are at the high level $V_H$.

If any one of the input signals Da to Dc, e.g., the input signal Da is at the low level $V_L$, as shown in FIG. 1, the drain current $I_D$ of the MOSFETs Q1 to Q3 is reduced. As a result, the transistor T1 has its collector supplied with a small collector current substantially equal to the current $I_L$. Therefore, the collector potential $V_C$ of the transistor T1 is expressed by the following equation:

$$V_C = V_{DD} - I_L \cdot R1.$$

Here, the power supply voltage $V_{DD}$ is at the ground potential of the circuit, i.e., at 0 V so that the above equation is transformed into the following equation:

$$V_C = -I_L \cdot R1.$$

Therefore, the output signal Do of this logic circuit is expressed by the following if the base-emitter voltage of the output transistor T2 is designated at $V_{BE}$:

$$Do = -(I_L \cdot R1 + V_{BE}) \qquad (1).$$

The value of this equation (1) is made to correspond to the high level $V_H$ of the aforementioned input signals Da to Dc.

If, on the other hand, all the input signals Da to Dc are set at the high level $V_H$, the drain current $I_D$ of the MOSFETs Q1 to Q3 is increased. As a result, a relatively large collector current substantially equal to the current $I_H$ flows through the collector of the transistor T1. Therefore, the collector $V_C$ of the transistor T1 is expressed by the following equation:

$$V_C = -I_H \cdot R1.$$

As a result, the output signal Do of this logic circuit is expressed by the following equation:

$$Do = -(I_H \cdot R1 + V_{BE}) \qquad (2).$$

The value of this equation (2) is made to correspond to the low level $V_L$ of the aforementioned input signals Da to Dc.

More specifically, the logic circuit of FIG. 1 has its output signal Do selectively takes the low level $V_L$, i.e., the logic "0", when all the input signals Da to Dc take the high level $V_H$, i.e., the logic "1", and functions as a NAND gate circuit satisfying the following logic equation:

$$Do = \overline{Da \cdot Db \cdot Dc} \qquad (3).$$

Here, the operating current supplied by the logic circuit of FIG. 1 is restricted to only the current $I_H$ to be supplied when the condition of the above-specified equation (3) is satisfied, by reducing the current value of the constant current supply IS1 of the output emitter-follower circuit is reduced to a sufficiently small value. In case the high-speed logic integrated circuit is equipped with a multiplicity of similar logic circuits, the probability that the corresponding logic conditions are satisfied to supply the aforementioned current $I_H$ to the logic circuit is so relatively low that the operating current of the high-speed logic integrated circuit as a whole is accordingly reduced to a small value.

As has been described hereinbefore, the logic circuit of the present embodiment is basically constructed of: the bipolar transistor T1 having its collector coupled through the load resistance R1 to the ground potential of the circuit and its base adapted to be supplied with the predetermined voltage $V_{CS}$; and a logic block coupled between the emitter of the transistor T1 and the power supply voltage $V_{SS}$ of the circuit and composed of the three MOSFETs Q1 to Q3 connected in series. The high-speed logic integrated circuit includes a multiplicity of logic circuits having a similar circuit structure. The signals outputted from the individual logic circuits to the gates of the MOSFETs constituting the corresponding logic blocks of the logic circuits are made to have such a sufficiently small signal amplitude, e.g., 0.8 V as to cause a predetermined change in the drain current of at least the corresponding MOSFETs. As a result, the high-speed logic integrated circuit of the present embodiment can enjoy both a reduced time required for charging or discharging the stray capacitance and high-speed logic operations, although it is basically constructed of a composite circuit of the MOSFETs and the bipolar transistor, which have a low power consumption and can be integrated relatively easily. Accordingly, the operating current required for the charging or discharging is reduced to promote the low power consumption.

Next, other features of the bipolar CMOS logic circuit shown in FIG. 1 will be described in the following.

The bipolar transistor T1 is provided to retain the hot-carrier breakdown voltage of the MOSFETs Q1 to Q3 coupled between the emitter of the transistor T1 and the power supply voltage $V_{SS}$ of the circuit and to reduce the power supply voltage dependency of the amplitude of the output signal coming from the collector of the transistor T1.

Specifically, when the gate length Lg of the MOSFETs Q1 to Q3 is made fine to effect the high speed and the high integration, the hot-carrier breakdown voltage of the MOSFETs Q1 to Q3 drops so that the emitter potential of the bipolar transistor T1 is set to retain the hot-carrier breakdown voltage of the MOSFETs Q1 to Q3. Accordingly, the value of the potential $V_{CS}$ to be applied to the base electrode of the bipolar transistor T1 is determined considering the hot-carrier breakdown voltage of the MOSFETs Q1 to Q3. In other words, each drain-source voltage $V_{DS}$ of the circuit of FIG. 1 is set at a level no more than the hot-carrier breakdown voltage of the MOSFETs Q1 to Q3 by the aforementioned potential $V_{CS}$.

In case, on the other hand, the MOSFETs Q1 to Q3 are coupled between the emitter electrode of the bipolar transistor T1 and the power supply potential of the circuit, the drain-source voltage $V_{DS}$ of the MOSFETs Q1 to Q3 is fluctuated with the fluctuations of the aforementioned power supply potential $_{SS}$. As a result, the drain current $I_D$ of each of the MOSFETS Q1 to Q3 is fluctuated with the fluctuations of the drain supply voltage $V_{DS}$. As a result, the collector current $I_C$ of the bipolar transistor T1 fluctuates, and the amplitude of the output signal fluctuates. This power supply voltage dependency of the amplitude of the output signal is reduced by giving an opposite dependency to the current voltage dependency of the output signal amplitude to the voltage $V_{CS}$ to be supplied to the base of the transistor T1.

Figure 7:
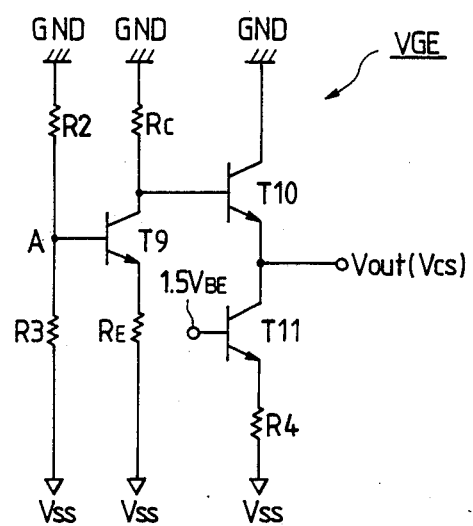
FIG. 7 is a circuit diagram showing a voltage generating circuit for generating a voltage $V_{CS}$ to be supplied to the base of a bipolar transistor of a logic circuit according to the present invention.

FIG. 7 shows one example of a voltage generating circuit VGE for generating the voltage $V_{CS}$ having the aforementioned power supply voltage dependency.

This voltage generating circuit VGE is constructed of: resistance elements connected in series between the ground potential GND of the circuit and the power supply voltage $V_{SS}$ of the circuit; an NPN type bipolar transistor T9 having its base coupled to the common connection node A of the resistances R2 and R3, its collector coupled through a resistance element RC to the ground potential GND and its emitter coupled through a resistance element RE to the power supply voltage $V_{SS}$; an NPN type bipolar transistor T10 having its base coupled to the collector of the aforementioned bipolar transistor T9, its collector coupled to the ground potential GND and its emitter coupled to an output terminal Vout; and an NPN bipolar transistor T11 having its collector coupled to the output terminal Vout, its base adapted to receive a reference voltage of 1.5 $V_{BE}$ and its emitter coupled through a resistance element R4 to the power supply voltage $V_{SS}$.

The output voltage $V_{CS}$ of the voltage generating circuit VGE thus constructed is expressed by the following equation:

$$\begin{aligned} V_{CS} &= [-(R3 V_{SS}/(R2 + R3) - V_{BE}T9)]RC/RE - V_{BE}T10 \\ &= -R3/(R2 + R3) \cdot RC/RE \cdot V_{SS} \\ &\quad - (V_{BE}T10 - RC/RE V_{BE}T9). \end{aligned} \quad (1)$$

Here, the $V_{BE}T9$ is the base-emitter forward voltage of transistor T9, and the $V_{BE}T10$ is the base-emitter forward voltage of the bipolar transistor T10.

In case $V_{BE}T9 = V_{BE}T10$, moreover, the equation (1) is transformed into the following equation (2):

$$V_{CS} = -R3/(R2+R3) \cdot RC/RE \cdot V_{SS} - (1 - RC/RE) \cdot V_{BE} \quad (2).$$

Hence, this equation (2) depends upon the power supply voltage $V_{SS}$ because it has a first term depending upon the power supply voltage $V_{SS}$. Here, the desired power supply voltage $V_{SS}$ is caused to appear at the voltage $V_{CS}$ by setting the coefficient at a value of 1 or more, e.g., 1.2.

By providing such voltage generating circuit VGE, the voltage $V_{CS}$ is raised (or dropped) accordingly as the power supply potential $V_{SS}$ is raised (or dropped). As a result, the potential difference between the emitter potential of the bipolar transistor T1 and the power supply potential $V_{SS}$ is substantially held constant so that the drain-source potential $V_{DS}$ of the MOSFETs Q1 to Q3 is held constant. As a result, the drain current $I_D$ of the MOSFETs Q1 to Q3 is held constant so that the amplitude of the output signal appearing at the collector of the bipolar transistor T1 is held constant.

Moreover, the element characteristics of the bipolar transistor has a smaller process dispersion dependency than that of the MOSFET. As a result, the logic amplitude of the output signal of the circuit has its process dispersion reduced, in case the bipolar transistor T1 is provided as in FIG. 1, so that the process dispersion margin of the bipolar MOS logic circuit of the present invention is enlarged.

Here, the logic block coupled between the emitter of the bipolar transistor T1 and the power supply potential $V_{SS}$ of the circuit includes the plural MOSFETs Q1 to Q3. The layout area of these MOSFETs Q1 to Q3 can be made smaller than that of the bipolar transistor. As a result, the layout area of the bipolar CMOS circuit according to the present invention is reduced. Accordingly, the chip area of the semiconductor device including the plural bipolar CMOS circuit according to the present invention is reduced. Since, moreover, the logic block is formed of the plural MOSFETs, it is possible to reduce the power consumption of the logic block and to effect the operations in response to a clock signal.

Here, it could be easily understood that the items thus far described be applied to bipolar CMOS circuits shown in FIGS. 3, 4, 5 and 6.

In the description thus far made, the power supply voltage $V_{SS}$ of the circuit is set at the value of $-3$ V but may be a negative value such as $-5.2$ V. In case the power supply potential $V_{SS}$ is at $-5.2$ V, the value of the voltage $V_{CS}$ to be applied to the base of the bipolar transistor T1 is desirably set at about $-3.6$ V. In this case, moreover, the input signals Da, Db and Dc may be at the CMOS levels, i.e., at levels substantially corresponding to the difference voltage between the power supply voltage and the ground potential of the circuit or at levels having the signal amplitude (e.g., the high level $= V_{DD} - V_{BE}$, and the low level $= V_{SS} + V_{BE}$) of the output signal of the bipolar CMOS circuit of the prior art.

Figure 3:
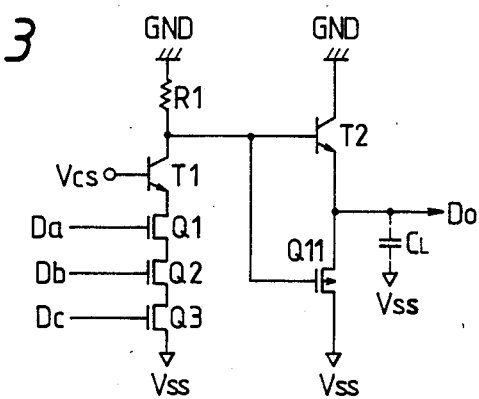
FIG. 3 is a circuit diagram showing another embodiment of a bipolar CMOS logic circuit included in a high-speed logic circuit to which is applied the present invention.

FIG. 3 is a circuit diagram showing a second embodiment of the logic circuit included in the high-speed logic integrated circuit to which is applied the present invention. In FIG. 3, the logic circuit basically follows the embodiment of FIG. 1 such that the bipolar transistors T1 and T2, the N-channel MOSFETs Q1 to Q3 and the load resistance R1 correspond as they are to the bipolar transistors T1 and T2, the N-channel MOSFETs Q1 to Q3 and the load resistance R1 of FIG. 1, respectively. An addition description will be made in the following upon the portion different from the embodiment of FIG. 1.

As shown in FIG. 3, a P-channel MOSFET Q11 is coupled between the emitter of the transistor T2 constituting the output emitter-follower circuit and the power supply voltage $V_{SS}$ of the circuit. The MOSFET Q11 is commonly coupled to the base of the aforementioned transistor T2. The emitter potential of the transistor T2 is set at the output signal Do of the logic circuit.

Incidentally, there is coupled to the output node of the logic circuit a relatively large stray capacitance $C_L$ which is present in a connecting wire at a downstream step. In the case of the embodiment of FIG. 1, the current value of the constant current supply IS1 constituting the output emitter-follower circuit is made as small as possible, as has been described hereinbefore. As a result, when the output signal Do is set at the high level, the charging of the stray capacitance $C_L$ through the transistor T2 is speeded up according to the conductance of the capacitance $C_L$. If, however, the output signal Do is at the low level, the discharging of the stray capacitance $C_L$ through the constant current supply IS1 having a small current value takes a long time to cause an obstruction against the speedup of the logic circuit. In the present embodiment, therefore, the logic circuit is speeded up by replacing the constant current supply IS1 of FIG. 1 by the MOSFET Q11. In other words, the output step of this logic circuit has a push-pull function.

When all the input signals Da to Dc to be supplied to the gates of the MOSFETs Q1 to Q3 are at the high level, the collector potential of the transistor T1 takes the predetermined low level. At this time, the MOSFET Q11 has its gate potential set at the low level, its conductance is increased. As a result, the high level of the stray capacitance $C_L$ coupled to the output node is abruptly discharged through the MOSFET Q11 to the low level.

If, on the other hand, any of the input signals Da to Dc is at the low level, the transistor T1 has its collector potential set at the predetermined high level. At this time, the MOSFET Q11 has its gate potential set at the high level to have its conductance reduced. As a result, the MOSFET Q11 acts as load means of high resistance for the transistor T2 constituting the output emitter-follower circuit.

In the logic circuit of the present embodiment, as has been described hereinbefore, the constant current supply IS1 constituting the output emitter-follower circuit together with the transistor T2 in the foregoing embodiment of FIG. 1 is replaced by the P-channel MOSFET Q11. This MOSFET Q11 has its gate commonly coupled to the base of the base of the transistor T2 so that its conductance is selectively enlarged at the instant of the low-level output. As a result, when the output signal Do of the logic circuit is at the low level, the discharging of the stray capacitance $C_L$ coupled to the output node thereof is speeded up so that the operations of the logic circuit are drastically speeded up. Incidentally, the MOSFET Q11 can be replaced by a PNP type bipolar transistor.

Figure 4:
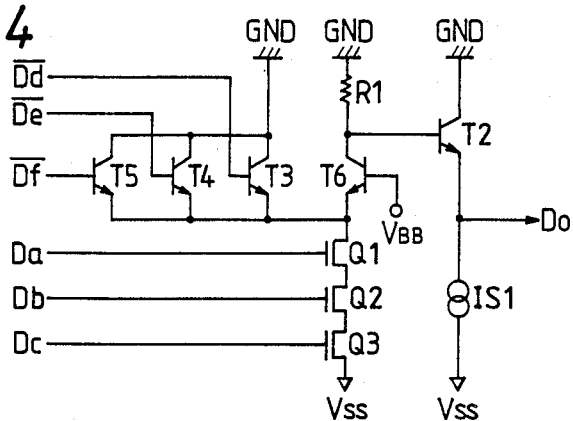
FIG. 4 is a circuit diagram showing still another embodiment of a bipolar MOS logic circuit included in a high-speed logic circuit to which is applied the present invention.

FIG. 4 is a circuit diagram showing a third embodiment of the logic circuit included in the high-speed logic integrated circuit to which is applied the present invention. In FIG. 4, the logic circuit basically follows the embodiment of FIG. 1, and the bipolar transistor T2, the N-channel MOSFETs Q1 to Q3, the load resistance R1 and the constant current supply LS1 correspond as they are to the bipolar transistor T2, the N-channel MOSFETs Q1 to Q3, the load resistance R1 and the constant current supply LS1 of FIG. 1, respectively. An additional description will be made in the following upon only the portion different from the embodiment of FIG. 1.

In FIG. 4, a bipolar transistor T6 is coupled between the logic block composed of the MOSFETs Q1 to Q3 and the load resistance R1. The transistor T6 has its base supplied with a predetermined reference voltage $V_{BB}$ from the not-shown constant voltage generating circuit of the high-speed logic integrated circuit. The logic circuit of the present embodiment is equipped with three bipolar transistors T3 to T5 (i.e., third, fourth and fifth bipolar transistors) which have their emitter-collector paths coupled in parallel in a differential form with the aforementioned transistor T6. These transistors T3 to T5 have their bases supplied with corresponding inverse input signals $\overline{Dd}$ to $\overline{Df}$ from other not-shown logic circuits of the high-speed logic integrated circuit.

The inverse input signals $\overline{Dd}$ to $\overline{Df}$ are made to have a relatively small signal amplitude such as 0.8 V like the aforementioned input signals Da to Dc. However, the logic conditions are inverted so that the individual input signals are selectively set at the low level for the logic "1" and at the high level for the logic "0". The aforementioned reference potential $V_{BB}$ is set at an intermediate level between the high and low levels of the inverse input signals $\overline{Dd}$ to $\overline{Df}$. As a result, the transistor T6 and transistors T3 to T5 in the differential form function as a current switch circuit for setting the reference potential $V_{BB}$ at a logic threshold level.

When any of the inverse input signals $\overline{Dd}$ to $\overline{Df}$ is set at the high level, the corresponding one of the transistors T3 to T5 is rendered conductive by having its base potential raised to a level higher than the reference potential $V_{BB}$. At this time, the transistor T6 is cut off to have its collector potential raised to the high level such as the ground potential of the circuit irrespective of the input signals Da to Dc. The high level of the collector potential of the transistor T6 is shifted to an extent corresponding to the base-emitter voltage $V_{BE}$ of the transistor T2 constituting the output emitter-follower circuit until it is set at the output signal Do. As a result, the high level $V_H$ of the output signal Do is expressed by the following equation:

$$V_H = -V_{BE} \tag{4}$$

When, on the contrary, all the inverse input signals $\overline{Dd}$ to $\overline{Df}$ are at the low level, the transistors T3 to T5 are cut off by having their base potentials set at levels lower than the reference potential $V_{BB}$. At this time, the transistor T6 is rendered conductive so that the current $I_H$ is supplied to the load resistance R1 on condition that all the input signals Da to Dc to be supplied to the gates of the MOSFETs Q1 to Q3 are set at the high level. As a result, the collector potential $V_C$ of the transistor T6 takes the low level, as expressed by the following equation:

$$V_C = -I_H \times R1.$$

The collector potential $V_C$ of the transistor T6 is shifted to an extent corresponding to the base-emitter voltage $V_{BE}$ of the transistor T2 constituting the output emitter-follower circuit until it is used as the output signal Do of the logic circuit. Hence, the low level $V_L$ of the output signal Do is expressed by the following equation:

$$V_L = -(I_H \times R1 + V_{BE}).$$

When all the inverse input signals $\overline{Dd}$ to $\overline{Df}$ are at the low level so that the transistor T6 is rendered conductive, a very small current $I_L$ is supplied to the load resistance R1 if any of the input signals Da to Dc to be supplied to the gates of the MOSFETs Q1 to Q3 is at the low level. Hence, the collector potential $V_C$ of the transistor T6 takes the high level, as expressed by the following equation:

$$V_C = -I_L \cdot R1.$$

The output signal Do of this logic circuit is set at the high level, as expressed by the following equation:

$$V_H = -(I_L \cdot R1 + V_{BE}) \tag{5}$$

Specifically, when all the input signals Da to Dc are set at the high level $V_H$, i.e., the logic "1" and when all the inverse input signals $\overline{Dd}$ to $\overline{Df}$ are set at the low level, i.e., the logic "1", the logic circuit of FIG. 4 has its output signal Do selectively set at the low level $V_L$, i.e., the logic "0" so that it functions as a NAND gate circuit satisfying the following logic equation:

$$Do = \overline{Da \cdot Db \cdot Dc(\overline{Dd} + \overline{De} + \overline{Df})}$$

$$= \overline{Da \cdot Db \cdot Dc \cdot Dd \cdot De \cdot Df}.$$

Incidentally, the output signal Do of this logic circuit selectively takes either of the two high levels $V_H$ expressed by the foregoing equations (4) and (5), according to the levels of the input signals Da to Dc when it is set at the high level.

As has been described hereinbefore, the logic circuit of the present embodiment includes the transistor T6 having its base corresponding to the transistor T1 of the foregoing embodiment of FIG. 1 and adapted to receive the reference potential $V_{BB}$. With the transistor T6, there are disposed in the differential form the three transistors T3 to T5 which are connected in parallel to have their bases adapted to be supplied with the corresponding inverse input signals $\overline{Dd}$ to $\overline{Df}$. As a result, the logic circuit has its output signal Do selectively set at the low level, on condition that all the input signals Da to Df are set at the high level and that the all the inverse input signals Dd to Df are set at the low level, so that it functions as an NAND gate circuit for the six input signals Da to $\overline{Df}$. In other words, when the bit number of the input signals increases, the logic threshold level owned by the logic block is raised by the conductance of the MOSFET if an N-channel MOSFET is coupled in series to the MOSFETs Q1 to Q3. As a result, the fan-in number as the logic circuit is increased without influencing the logic threshold level, by providing a plurality of bipolar transistors which are coupled in parallel in the differential form with the transistor T6 and have their bases adapted to receive the corresponding inverse input signals.

Figure 5:
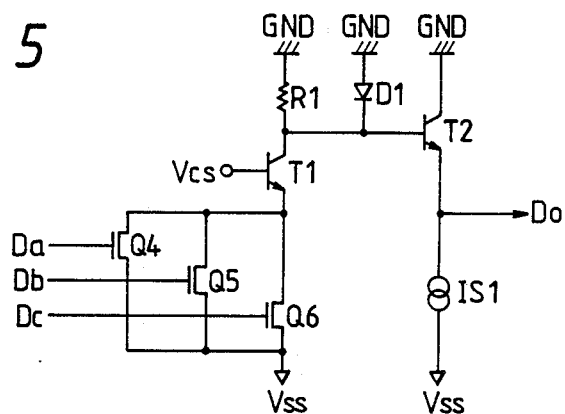
FIG. 5 is a circuit diagram showing a further embodiment of a bipolar MOS logic circuit included in a high-speed logic circuit to which is applied the present invention.

FIG. 5 is a circuit diagram showing a third embodiment of the logic circuit included in the high-speed logic integrated circuit to which is applied the present invention. In FIG. 5, the logic circuit basically follows the embodiment of FIG. 1, and the bipolar transistors T1 and T2, the load resistance R1 and the constant current supply LS1 correspond as they are to the bipolar transistors T1 and T2, the load resistance R1 and the constant current supply LS1 of FIG. 1, respectively. An additional description will be made in the following upon only the portion different from the embodiment of FIG. 1. In FIG. 5, the logic block of the logic circuit is constructed of three N-channel MOSFETs Q4 to Q6 (i.e., fourth, fifth and sixth MOSFETs) having their source-drain paths coupled in parallel. These MOSFETs have their gates supplied with the corresponding input signals Da to Dc. With the load resistance R1, there is coupled in parallel a diode D1 which is not especially limitative. This diode D1 is designed to have a predetermined forward voltage $V_{DF}$.

When any of the input signals Da to Dc is set at the high level, the corresponding one of the MOSFETs Q4 to Q6 has its conductance increased so that it is supplied with the relatively large drain current $I_H$. As a result, the transistor T1 is supplied with a relatively large collector current corresponding to the aforementioned drain current $I_H$ so that its collector potential $V_C$ takes the low level. As a result, the low level of the collector potential of the transistor T1 is different depending upon how many of the MOSFETs Q4 to Q6 have their conductances simultaneously increased by the input signals Da to Dc. In other words, when all the input signals Da to Dc are set at the high level so that the conductances of all the three MOSFETs Q4 to Q6 are simultaneously increased, the low level of the collector potential of the transistor T1 may possibly be dropped to the lowest level to saturate the transistor T1. Here, the saturation state is defined as the state in which the collector potential $V_C$ of the bipolar transistor is set at a level lower than the base potential $V_B$.

In order to cope with this, the logic circuit of the present embodiment is equipped with the aforementioned diode D1 which is coupled in parallel with the load resistance R1. When the input signals Da to Dc are set altogether at the high level so that the transistor T1 has its collector potential dropped to have its absolute value exceeding the forward voltage $V_{DF}$ of the diode D1, the diode D1 comes into the so-called "ON state" to clamp the collector potential of the transistor T1 at the aforementioned forward voltage $V_{Df}$. At this time, the low level $V_L$ of the output signal Do is expressed by the following equation:

$$V_L = -(V_{DF} + V_{BE}).$$

Thus, the transistor T1 fails to reach the saturation state but has its operations speeded up by having its collector potential clamped. Since, moreover, the collector potential of the transistor T1 is clamped, the low level $V_L$ of the output signal Do is determined so that the operations of the logic circuit at the downstream step are stabilized.

When all the input signals Da to Dc are set at the low level, the MOSFETs Q4 to Q6 have their conductances reduced and are supplied with the small drain current $I_L$. As a result, the transistor T1 is supplied with a small collector current three times as large as the drain current $I_L$ so that its collector potential $V_C$ takes the high level, as expressed by the following equation:

$$V_C = -3 \cdot I_L \cdot R1.$$

This high level is shifted to an extent corresponding to the base-emitter voltage $V_{BE}$ of the transistor T2 constituting the output emitter-follower circuit until it is set at the output signal Do of the logic circuit. At this time, the high level $V_H$ of the output signal Do is expressed by the following equation:

$$V_H = -(3 \cdot I_L \cdot R1 + V_{BE}).$$

From these, the logic circuit of the present embodiment has its output signal Do dropped to the low level as a result that any of the input signals Da to Dc is set at the high level, that is to say, its output signal Do selectively raised to the high level as a result that all the input signals Da to Dc are dropped to the low level, so that it functions as a NOR gate satisfying the following logic equation:

$$Do = \overline{Da + Db + Dc}$$

$$= \overline{Da} \cdot \overline{Db} \cdot \overline{Dc}.$$

As has been described hereinbefore, the logic circuit of the present embodiment has its logic block composed of the three N-channel MOSFETs Q4 to Q6, which are coupled in parallel, so that it functions as a NOR gate for the input signals Da to Dc supplied to the gates of those MOSFETs Q4 to Q6. The collector current of the transistor T1 is different depending upon how many of the of the MOSFETs Q4 to Q6 have their conductances increased by the aforementioned input signals Da to Dc. In the logic circuit of the present embodiment, however, the diode D1 having the predetermined forward voltage $V_{DF}$ is coupled in parallel with the load resistance R1 so that the low level of the collector potential of the transistor T1 is clamped by the forward voltage $V_{DF}$. As a result, the transistor T1 is not saturated, but the low level of the output signal of the logic circuit is determined so that the operations of the logic circuit at the downstream step are stabilized.

Figure 6:
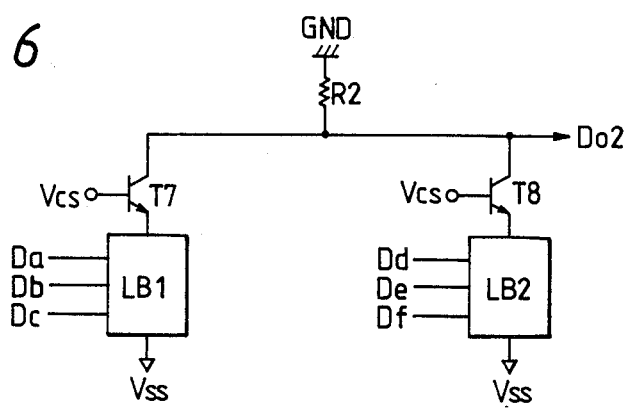
FIG. 6 is a circuit diagram showing a further embodiment of a bipolar MOS logic circuit included in a high-speed logic circuit to which is applied the present invention.

FIG. 6 is a circuit diagram showing a fifth embodiment of the logic circuit included in the high-speed logic integrated circuit to which is applied the present invention. In FIG. 6, the connection of two logic circuits is illustrated by way of example such that the logic blocks are symbolically designated at LB1 and LB2.

In FIG. 6, there is coupled between the emitter of a transistor T7 and the power supply voltage $V_{SS}$ of the circuit the logic block LB1 which is composed of three N-channel MOSFETs to be supplied at their gates with the corresponding input signals Da to Dc, respectively. Moreover, there is coupled between the emitter of a transistor T8 and the power supply voltage $V_{SS}$ of the circuit the logic block LB2 which is composed of three N-channel MOSFETs to be supplied at their gates with the corresponding input signals Dd to Df, respectively. In the present embodiment, the structure of each logic block is assumed to be composed of the three series MOSFETs so as to simplify the description although it raises no serious problem. Specifically, the MOSFETs Q1 to Q3 of FIG. 1 are disposed in each logic block LB1 or LB2.

The transistors T7 and T8 have their bases supplied with the predetermined constant voltage $V_{CS}$. This constant voltage $V_{CS}$ corresponds to the constant voltage $V_{CS}$ of the foregoing embodiment of FIG. 1.

The transistor T7 has its collector coupled through the load resistance R2 to the ground potential of the circuit. On the other hand, the transistor T8 has its collector commonly coupled to the collector of the transistor T7. The potential at the commonly coupled node of the collectors of the transistors T7 and T8 is used as an output signal Do2, i.e., the input signal of the not-shown logic circuit of the high-speed logic integrated circuit.

The output signal Do2 is set at the low level when the collector potential of either the transistor T7 or T8 is set at the low level. When, on the contrary, both the collector potentials of the transistors T7 and T8 are set at the high level, the output signal Do2 is selectively set at the high level. Specifically, the output signal Do2 satisfies the following logic condition:

$$Do2 = \overline{(Da \cdot Db \cdot Dc)} + \overline{(Dd \cdot De \cdot Df)}$$

$$= (\overline{Da} + \overline{Db} + \overline{Dc})(\overline{Dd} + \overline{De} + \overline{Df}).$$

In the high-speed logic integrated circuit of the present embodiment, as has been described hereinbefore, the collectors of the transistors constituting the logic gates are commonly coupled in a predetermined combination and further coupled through the load resistances to the ground potentials of the circuit so that a variety of logic circuits can be efficiently constructed. In the present embodiment, the foregoing output emitter-follower circuits of the first to fourth embodiments are omitted to further simplify the structure of the individual logic circuits. The logic blocks LB1 and LB2 of FIG. 6 may be equipped with the MOSFETs Q4 to Q6 of FIG. 5. In this modification, it is quite natural that the diode D1 shown in FIG. 5 could be added to FIG. 6.

As has been described in the foregoing plural embodiments, the following effects can be attained in case the present invention is applied to the semiconductor integrated circuit device such as the high-speed logic integrated circuit including the plural logic circuits:

(1) The logic circuit included in the high-speed logic integrated circuit or the like can be realized to operate within a relatively small amplitude with a relatively small number of circuit elements by constructing it basically of: the bipolar transistor having its collector coupled through the load resistance to the first power supply voltage and its base adapted to receive the predetermined constant voltage or the correspondingly input signal; and the logic block coupled between the emitter of the bipolar transistor and the second power supply voltage and formed by combining one or more MOSFETs having their gates adapted to receive the corresponding input signals.

(2) According to the above effect (1), the amplitude of the signal to be transmitted between the logic circuits can be reduced, and the time period required for charging or discharging the stray capacitance coupled to the connection wires and the individual circuit elements can be shortened. As a result, the operations of the high-speed logic integrated circuit including the multiple logic circuits can be speeded up.

(3) Thanks to the effects (1) and (2), the current to be consumed for charging or discharging the stray capacitance or the like can be reduced so that the power consumption of the high-speed logic integrated circuit including the multiple logic circuits can be dropped.

(4) Thanks to the effect (1), the number of the elements of the logic circuit can be reduced so that the area required for the layout of the high-speed logic integrated circuit or the like including the multiple logic circuits can be reduced to promote the cost reduction.

Although our invention has been specifically described in connection with the embodiments thereof, it should not be limited to the embodiments but can naturally be modified in various manners without departing from the scope thereof. In the individual embodiments, for example, the logic block can be made to take an arbitrary structure according to the logic conditions required, and an arbitrary number of MOSFETs can be combined according to the number of input signals. Moreover, each logic circuit may use P-channel MOSFETs in place of the N-channel MOSFETs Q1 to Q6. In this case, the logic conditions of the logic circuit are inverted. The logic circuit of each embodiment may use load means other than the resistance. Moreover, the output emitter-follower circuit may use load means other than the constant current source. The output emitter-follower circuit itself may be omitted. In FIG. 2, the low level $V_L$ may be set at a level lower than the value which is determined by subtracting the threshold voltage $V_{THN}$ of the N-channel MOSFETs from the power supply voltage $V_{SS}$ of the circuit. Moreover, the signal amplitude of the output signal Do and the power supply voltage $V_{SS}$ of the circuit can take arbitrary values. In FIG. 4, the load resistance R1 may be coupled between the commonly coupled collectors of the parallel transistors T3 to T5 and the ground potential of the circuit. In this case, the output signal Do is selectively raised to the high level according to the following logic condition:

$$Do = \overline{(Da \cdot Db \cdot Dc) \cdot (\overline{Dd + De + Df})}$$

Still moreover, the specific circuit structures of the respective logic circuits shown in FIGS. 1 and 3 to 6, the combination of the input signals, and the power supply voltages can take a variety of modes of embodiment.

In the description thus far made, our invention has been described in case it is applied to the high-speed integrated circuit or the background field of application. However, the invention should not be limited thereto but can be applied to a variety of semiconductor memory devices or digital integrated circuits including similar logic circuits. The present invention can be widely applied to a semiconductor integrated circuit device including at least the logic circuit.

The effects obtained from the representatives of the invention to be disclosed hereinbefore will be briefly described in the following. A logic circuit included in the high-speed logic integrated circuit and capable of operating within a relatively small amplitude can be realized by constructing it basically of: the bipolar transistor having its collector coupled through the load resistance to the first power supply voltage and its base adapted to be supplied at its base with the predetermined constant voltage or the corresponding input signal; and the logic block coupled between the emitter of the bipolar transistor and the second power supply voltage and composed of one or more MOSFETs adapted at their gates with the input signals. As a result, it is possible to speed up the operations of the high-speed logic integrated circuit or the like including the multiple logic circuits and to drop the power consumption.

What is claimed is:

1. A logic circuit comprising:
   first and second power supply terminals for receiving first and second supply voltages;
   an output terminal;
   at least one input terminal for receiving an input signal;
   load means coupled between said first power supply terminal and said output terminal;
   a first bipolar transistor coupled to have a collector coupled to said output terminal, a base coupled to be supplied with a predetermined voltage, and an emitter; and
   a first MOSFET coupled to have a source-drain path coupled between the emitter of said bipolar transistor and said second power supply terminal, and a gate coupled to said input terminal,
   wherein a plurality of said input terminals are provided, and
   wherein said logic circuit further comprises:
   a second MOSFET coupled to have a source-drain path coupled between the source-drain path of said first MOSFET and said second power supply terminal, and a gate coupled to receive an input signal to be supplied to the input terminal different from that coupled to the date of said first MOSFET.

2. A logic circuit comprising:
   first and second power supply terminals for receiving first and second supply voltages;
   an output terminal;
   at least one input terminal for receiving an input signal;
   load means coupled between said first power supply terminal and said output terminal;
   a first bipolar transistor coupled to have a collector coupled to said output terminal, a base coupled to be supplied with a predetermined voltage, and an emitter; and
   a first MOSFET coupled to have source-drain path coupled between the emitter of said bipolar transistor and said second power supply terminal, and a gate coupled to said input terminal,
   wherein a plurality of said input terminals are provided, and
   wherein said logic circuit further comprises:
   a second MOSFET coupled to have a source-drain path coupled between the emitter of said first bipolar transistor and said second power supply terminal, and a gate coupled to receive an input signal to be supplied to the input terminal different from that coupled to the gate of said first MOSFET.

3. A logic circuit according to claim 2, further comprising:
   diode means coupled between said first power supply terminal and said output terminal to prevent said first bipolar transistor from operating in an unsaturation region.

4. A logic circuit comprising:
   first and second power supply terminals for receiving first and second supply voltages;
   an output terminal;
   at least one input terminal for receiving an input signal;
   load means coupled between said first power supply terminal and said output terminal;
   a first bipolar transistor coupled to have a collector coupled to said output terminal, a base coupled to be supplied with a predetermined voltage, and an emitter;
   a first MOSFET coupled to have a source-drain path coupled between the emitter of said bipolar transistor and said second power supply terminal, and a gate coupled to said input terminal;
   a second bipolar transistor coupled to have an emitter-collector path coupled between said first power supply terminal and said output, and a base coupled to said output terminal,
   further comprising:
   current source means coupled between said output and said second power supply terminal.

5. A logic circuit comprising:
   first and second power supply terminals for receiving first and second supply voltages;
   an output terminal;
   at least one input terminal for receiving an input signal;
   load means coupled between said first power supply terminal and said output terminal;
   a first bipolar transistor coupled to have a collector coupled to said output terminal, a base coupled to be supplied with a predetermined voltage, and an emitter;
   a first MOSFET coupled to have a source-drain path coupled between the emitter of said bipolar transistor and said second power supply terminal, and a gate coupled to said input terminal;
an output; and
a second bipolar transistor coupled to have an emitter-collector path coupled between said first power supply terminal and said output, and a base coupled to said output terminal,
further comprising:
an output MOSFET coupled to have a source-drain path coupled between said output and said second power supply terminal, and a gate coupled to the base of said second bipolar transistor,
wherein said second bipolar transistor and said output MOSFET are complementarily operated to one another.

6. A logic circuit comprising:
first and second power supply terminals for receiving first and second supply voltages;
an output terminal;
at least one input terminal for receiving an input signal;
load means coupled between said first power supply terminal and said output terminal;
a first bipolar transistor coupled to have a collector coupled to said output terminal, a base coupled to be supplied with a predetermined voltage, and an emitter; and
a first MOSFET coupled to have a source-drain path coupled between the emitter of said bipolar transistor and said second power supply terminal, and a gate coupled to said input terminal,
further comprising:
an output circuit for receiving an output signal on said output terminal and executing charging and discharging of an output capacitance of said output circuit in response to said received output signal.

7. A logic circuit comprising:
first and second power supply terminals for receiving first and second supply voltages;
an output terminal;
at least one input terminal for receiving an input signal;
load means coupled between said first power supply terminal and said output terminal;
a first bipolar transistor coupled to have a collector coupled to said output terminal, a base coupled to be supplied with a predetermined voltage, and an emitter; and
a first MOSFET coupled to have a source-drain path coupled between the emitter of said bipolar transistor and said second power supply terminal, and a gate coupled to said input terminal,
further comprising:
wherein a plurality of said input terminals are provided, and
wherein said logic circuit further comprises:
a bipolar transistor coupled to have an emitter-collector path coupled between said first power supply terminal and the emitter of said first bipolar transistor, and a base coupled to receive an input signal to be supplied from the input terminal different from that coupled to the gate of said first MOSFET.

8. A semiconductor integrated circuit device comprising:
a logic circuit for receiving input signals at its input terminals to produce an output signal of ECL level at its output terminal, said logic circuit including:
load means for converting a current signal into a voltage signal according to said current signal, said load means being coupled between said output terminal and a first power supply terminal to be supplied with a first power supply voltage of said circuit device;
a first bipolar transistor having a base coupled to receive a predetermined voltage, a collector coupled to said output terminal, and an emitter; and
a plurality of MOSFETs having gates coupled to receive said input signals, respectively, and source-drain paths coupled between the emitter of said first bipolar transistor and a second power supply terminal to be supplied with a second power supply voltage of said circuit device, said first power supply voltage being higher than said second power supply voltage.

9. A semiconductor integrated circuit device according to claim 8,
wherein said first bipolar transistor is of an NPN type, and
wherein said plurality of MOSFETs are of an N-channel type.

10. A semiconductor integrated circuit device according to claim 8,
wherein the source-drain paths of said plurality of MOSFETs are coupled in series between the emitter of said first bipolar transistor and said second power supply terminal.

11. A semiconductor integrated circuit device according to claim 8,
wherein the source-drain paths of said plurality of MOSFETs are coupled in parallel between the emitter of said first bipolar transistor and said second power supply terminal.

12. A semiconductor integrated circuit device according to claim 8, further comprising:
a second bipolar transistor coupled to have a base coupled to said output terminal, a collector coupled to said first power supply terminal, and an emitter for producing an output.

13. A semiconductor integrated circuit device comprising:
a plurality of logic circuits coupled to one another each for receiving input signals at its input terminals each to produce an output signal of ECL level at its output terminal, each of said logic circuits including:
load means for converting a current signal into a voltage signal according to said current signal, said load means being coupled between said output terminal and a first power supply terminal to be supplied with a first power supply voltage of said circuit device;
a first bipolar transistor having a base coupled to receive a predetermined voltage, a collector coupled to said output terminal, and an emitter; and
a plurality of MOSFET having gates coupled to receive said input signals, respectively, and source-drain paths coupled between the emitter of said first bipolar transistor and a second power supply terminal to be supplied with a second power supply voltage of said circuit device, said first power supply voltage being higher than said second power supply voltage.

14. A semiconductor integrated circuit device according to claim 13, wherein said first bipolar transistor is of an NPN type, and
wherein said plurality of MOSFETs are of an N-channel type.

15. A semiconductor integrated circuit device according to claim 13,
wherein said source-drain paths of said plurality of MOSFETs are coupled in series between the emitter of said first bipolar transistor and said second power supply terminal.

16. A semiconductor integrated circuit device according to claim 13,
wherein said source-drain paths of said plurality of MOSFETs are coupled in parallel between the emitter of said first bipolar transistor and said second power supply terminal.

17. A semiconductor integrated circuit device according to claim 13, further comprising:
a second bipolar transistor coupled to have a base coupled to said output terminal, a collector coupled to said first power supply terminal, and an emitter for producing an output.

18. A semiconductor integrated circuit device comprising:
first and second power supply terminals for receiving first and second supply voltages, respectively;
an output terminal;
an output bipolar transistor having an emitter-collector path coupled between the first supply voltage terminal and the output terminal, and a base, the output bipolar transistor executing one of charging and discharging of a capacitance associated with the output terminal in response to a base driving signal supplied to the base thereof;
means coupled between the output terminal and the second supply voltage terminal for executing the other of the charging and discharging of the capacitance;
a load circuit coupled between the first supply voltage terminal and the base of the output bipolar transistor;
a first bipolar transistor having a collector coupled to the base of the output bipolar transistor, a base coupled to receive a first input, and an emitter; and
a first MOSFET having a source-drain path coupled between the emitter of the first bipolar transistor and the second supply voltage terminal, and a gate coupled to receive a second input.

19. The circuit device of claim 18, wherein the means includes an output MOSFET having a source-drain path coupled between the output terminal and the second supply voltage terminal, and wherein the output MOSFET is turned on when the output bipolar transistor is turned off.

20. The circuit device of claim 19, wherein the output MOSFET has a gate coupled to the base of the output bipolar transistor.

21. The circuit device of claim 20, wherein the output bipolar transistor is of an NPN type, and wherein the output MOSFET is of a P-channel type.

22. The circuit device of claim 19, wherein the load circuit includes a resistance element coupled between the first supply voltage terminal and the base of the output bipolar transistor.

23. The circuit device of claim 22, wherein the load circuit further includes a level clamping element coupled between the first supply voltage terminal and the base of the output bipolar transistor.

24. The circuit device of claim 23, wherein a voltage difference between the first and second voltages is equal to or lower than 3.3 volt.

25. The circuit device of claim 24, wherein said circuit device provides an output signal at the output terminal of an ECL level.

26. The circuit device of claim 18, wherein the output and first bipolar transistors are of an NPN-type, and the first MOSFET is of an N-channel type.

27. The circuit device of claim 26, wherein a voltage difference between the first and second voltages is equal to or lower than 3.3 volt.

28. The circuit device of claim 18, further comprising:
a second MOSFET having a source-drain path coupled between the source-drain path of the first MOSFET and the second supply voltage, and a gate coupled to receive a third input.

29. The circuit device of claim 18, further comprising:
a second MOSFET having a source-drain path coupled between the emitter of the first bipolar transistor and the second supply voltage terminal, and a gate coupled to receive a third input.

30. A logic circuit included in a semiconductor device comprising:
first and second supply terminals for receiving first and second supply voltages, respectively, a difference voltage between the first and second voltages being equal to or lower than 3.3 volt;
an output terminal;
an output bipolar transistor having an emitter-collector path coupled between the first supply voltage terminal and the output terminal, and a base, the output bipolar transistor executing one of charging and discharging of a capacitance associated with the output terminal in response to a base driving signal supplied to the base thereof;
means coupled between the output terminal and the second supply voltage terminal for executing the other of the charging and discharging of the capacitance;
a load circuit coupled between the first supply voltage terminal and the base of the output bipolar transistor;
a first bipolar transistor having a collector coupled to the base of the output bipolar transistor, a base coupled to receive a first input, and an emitter; and
a first MOSFET having a source-drain path coupled between the emitter of the first bipolar transistor and the second supply voltage terminal, and a gate coupled to receive a second input.

31. The circuit device of claim 30, wherein the means includes an output MOSFET having a source-drain path coupled between the output terminal and the second supply voltage terminal, and wherein the output MOSFET is turned on when the output bipolar transistor is turned off.

32. The circuit device of claim 31, wherein the output MOSFET has a gate coupled to the base of the output bipolar transistor.

33. The circuit device of claim 32, wherein the output bipolar transistor is of an NPN type, and wherein the output MOSFET is of a P-channel type.

34. The circuit device of claim 31, wherein the load circuit includes a resistance element coupled between the first supply voltage terminal and the base of the output bipolar transistor.

35. The circuit device of claim 34, wherein the load circuit further includes a level clamping element coupled between the first supply voltage terminal and the base of the output bipolar transistor.

36. The circuit device of claim 35, wherein said circuit provides an output signal at the output terminal of an ECL level.

37. The circuit device of claim 30, wherein the output and first bipolar transistors are of an NPN type, and the first MOSFET is of an N-channel type.

38. The circuit device of claim 30, further comprising:
a second MOSFET having a source-drain path coupled between the source-drain path of the first MOSFET and the second supply voltage, and a gate coupled to receive a third input.

39. The circuit device of claim 30, further comprising:
a second MOSFET having a source-drain path coupled between the emitter of the first bipolar transistor and the second supply voltage terminal, and a gate coupled to receive a third input.

* * * * *